United States Patent [19]
Ota

[11] Patent Number: 5,831,739
[45] Date of Patent: Nov. 3, 1998

[54] ALIGNMENT METHOD

[75] Inventor: Kazuya Ota, Tokyo, Japan

[73] Assignee: Nikon Corporation, Tokyo, Japan

[21] Appl. No.: 631,127

[22] Filed: Apr. 12, 1996

[30] Foreign Application Priority Data

Apr. 13, 1995 [JP] Japan ................................. 7-088202

[51] Int. Cl.$^6$ ............................ G01B 11/00; G03B 27/42
[52] U.S. Cl. ............................. 356/401; 250/548; 355/53
[58] Field of Search ........................... 356/401; 250/548; 355/53, 54, 55

[56] References Cited

U.S. PATENT DOCUMENTS

| | | | |
|---|---|---|---|
| 4,780,617 | 10/1988 | Umatate et al. | 250/548 |
| 4,833,621 | 5/1989 | Umatate | 364/491 |
| 4,918,320 | 4/1990 | Hamasaki et al. | 250/548 |
| 5,153,678 | 10/1992 | Ota | 356/401 |
| 5,499,099 | 3/1996 | Sato et al. | 356/401 |
| 5,521,036 | 5/1996 | Iwamoto et al. | 356/401 |
| 5,525,808 | 6/1996 | Irie et al. | 250/548 |
| 5,561,606 | 10/1996 | Ota et la. | 364/490 |

*Primary Examiner*—Frank G. Font
*Assistant Examiner*—Zandia V. Smith
*Attorney, Agent, or Firm*—Armstrong, Westerman, Hattori, McLeland & Naughton

[57] ABSTRACT

An alignment method in which a plurality of areas on a wafer which are to be exposed are each aligned with respect to a reference position. The method includes: measuring array coordinates of a plurality of alignment measuring points; determining a reliability value for each alignment datum on the basis of a dispersion of differences (alignment data) between the measured array coordinates and the corresponding design values; calculating values of coordinate transformation parameters for obtaining actual array coordinates from the design array coordinates by using the reliability value as a weight; and obtaining array coordinates of each shot area by using the transformation parameters.

18 Claims, 5 Drawing Sheets

ALIGNMENT METHOD

BACKGROUND OF THE INVENTION

1. Field of the Invention

The present invention relates to a method for aligning a plurality of exposure areas, which are to be exposed, on a substrate which is a workpiece to be processed on the basis of the positions of alignment marks provided for the exposure areas. More particularly, the present invention relates to an alignment method which is suitably applied, for example, to an exposure system in which a reticle pattern is transferred onto each shot area on a wafer, to effect alignment of each shot area by statistical processing of the measured positions of a plurality of alignment marks on the wafer.

2. Description of the Related Art

In production of semiconductor devices, liquid crystal display devices, etc., by photolithography processes, a projection exposure apparatus (a stepper, etc.) is used in which a pattern formed on a reticle as a mask is projected onto each shot area on a wafer (or a glass plate or the like), which is coated with a photosensitive material, through a projection optical system. In this regard, a semiconductor device, for example, is formed by transferring a multiplicity of circuit patterns onto a wafer in an over-laid multilayer structure by exposure processes. Therefore, when a circuit pattern for the second or later layer is to be projected onto the wafer, it is necessary to carry out highly accurate alignment of the reticle pattern with respect to each shot area on the wafer where a circuit pattern has already been formed by a preceding exposure process. As a conventional wafer alignment method for use in a projection exposure apparatus, the following enhanced global alignment (hereinafter referred to as "EGA") method is known (for example, see U.S. Pat. No. 4,780,617).

In the EGA type alignment method, sample shot areas (sample shots) are selected from among a large number of shot areas on a wafer in advance, and coordinate values in the stage coordinate system of alignment marks (wafer marks) provided for the selected shot areas are measured, and array coordinates of each shot area are determined, for example, by performing such a linear approximation calculation (EGA calculation) in which the sum of squares of alignment errors, which are differences between the measured values (alignment data) and the design array coordinates reaches a minimum. Then, alignment of each shot area is carried out on the basis of the array coordinates calculated in this way.

However, in the above-described conventional EGA type alignment method, a plurality of items of alignment data may include so-called jump data (jump shot) in which the non-linear component, which is obtained by subtracting the linear component from the alignment error, is particularly large in comparison to the other alignment data. Such jump data is due to a measurement error caused by the deformation of a wafer mark corresponding to the alignment data, or due to a local non-linear distortion on the wafer. Therefore, if such jump data is used as it is to calculate array coordinates of shot areas other than the shot area provided with the defective wafer mark, the accuracy of the calculated array coordinates is likely to degrade.

One conventional method proposed to solve the above-described problem is such that jump data is detected from alignment data obtained, and an EGA type alignment is carried out with the detected jump data excluded.

There is another conventional method in which, as is disclosed by the present applicant in U.S. Pat. No. 5,153,678, a reliability value or confidence level is quantified for each item of alignment data according to the intensity of a detection signal which is obtained during detection of the position of each wafer mark by an alignment system or according to the bilateral symmetry of the detection signal, and the quantified reliability value is fed back for the EGA calculation. In other words, a reliability value is obtained for each alignment datum from information obtained during measurement for alignment, and a weight corresponding to the obtained reliability value or confidence level is added to each alignment error to thereby perform the EGA calculation.

Among the above-described conventional alignment methods, the method in which the EGA calculation is performed with the jump data excluded enables alignment of high accuracy when the obtained non-linear error component can be definitely decided to be jump data. However, when it is difficult to accurately judge whether the obtained non-linear error component indicates jump data or a simple dispersion in measurement, alignment data which should not be excluded may be excluded, or alignment data which should be excluded may be used.

Further, if an excessively large number of alignment data items are excluded, information from the wafer deviates locally, and as a result, the array of all shot areas on the wafer is estimated on the basis of only the information from an extremely small number of areas on the wafer. Consequently, alignment accuracy is degraded.

On the other hand, the conventional alignment method in which a reliability value is quantified for each alignment data item according to the condition of the detection signal is useful when a jump of the measured values is attributable to the condition of a wafer mark, for example. However, in a case where a wafer shot area (chip pattern) itself has been displaced from the regular array because of for example, a stepping error of the wafer stage or the like during the exposure in the previous process, no abnormality can be found in the detection signal obtained by the alignment system. Therefore, jump data cannot be detected. Accordingly, in order to use a method in which a confidence level is added as described above, it is necessary to quantify the reliability value from a viewpoint different from the condition of the detection signal.

SUMMARY OF THE INVENTION

A principal object of the present invention is to provide an alignment method in which, when array coordinates of a plurality of shot areas on a wafer are to be calculated by statistically processing measured coordinate values of a plurality of wafer marks (alignment marks) on the wafer, the effect of jump data in the measured coordinate values can be accurately reduced without depending on the condition of a wafer mark detecting signal.

Another object of the present invention is to provide an alignment method in which, when array coordinates of a plurality of shot areas on a wafer are to be calculated by statistically processing measured coordinate values of a plurality of marks on the wafer, the effect of jump data in the measured coordinate values can be accurately reduced by quantifying a reliability value for each measured value.

Still another object of the present invention is to provide an alignment method in which, when array coordinates of a plurality of shot areas on a wafer are to be calculated by statistically processing measured coordinate values of a plurality of marks on the wafer, the effect of jump data in the measured coordinate values can be accurately reduced by quantifying a reliability value for each measured value, and further estimating actual array coordinates by the linear approximation calculation of the measured values and using a confidence level corresponding to a dispersion of a difference between the estimated and measured array coordinates.

The present invention provides an alignment method for aligning each of a plurality of exposure areas on a substrate which are to be exposed are each aligned with respect to a reference position. The alignment method includes: the step (1) of measuring array coordinates of a plurality of alignment marks associated with a desired number of exposure areas among the plurality of exposure areas on the substrate; the step (2) of determining a reliability value for each of the array coordinates measured at the step (1); and the step (3) of estimating actual array coordinates of the plurality of exposure areas by using the reliability value determined at the step (2). On the basis of the array coordinates estimated at the step (3), the plurality of exposure areas are each sequentially aligned with respect to the reference position.

In the above-described method, the step (2) may comprise a step of quantifying a reliability value, which includes: estimating actual array coordinates of the number of array coordinates measured at the step (1) which is less than the above desired number by one, excluding the array coordinate at a predetermined point, by an EGA calculation using the number of array coordinate measurement results which is less than the above desired number by one, excluding the array coordinate measurement result at the predetermined point; determining a dispersion of a difference between each of the estimated array coordinates and the corresponding array coordinate measured at the step (1); and adding a confidence level corresponding to the determined dispersion to the array coordinate measurement result at the predetermined point.

In the above-described method, the step (2) may comprise another step of quantifying a reliability value, which includes: estimating an actual array coordinate of the array coordinate at a predetermined point among the array coordinates measured at the step (1) by an EGA calculation using the number of array coordinate measurement results which is less than the above desired number by one, excluding the array coordinate measurement result at the predetermined point; determining a size of a difference between the estimated array coordinate and the corresponding array coordinate measured at the step (1); and adding a reliability value which is approximately inversely proportional to the determined size to the array coordinate measurement result at the predetermined point.

In addition, the present invention provides another alignment method in which a plurality of exposure areas ($ES_1$, $ES_2$, . . . ) on a wafer are each sequentially aligned with respect to a reference position by measuring array coordinates of a plurality of alignment marks provided for a predetermined number of exposure areas which are to be measured among the plurality of exposure areas, and aligning each exposure area on the basis of array coordinates obtained by statistically processing the measured array coordinates. The method includes: the first step (Steps 101 and 102) of measuring array coordinates of the plurality of alignment marks; the second step (Step 103) of determining a reliability value for each of the array coordinates of the alignment marks on the basis of the values of the array coordinates measured at the first step; and the third step (Step 104) of estimating actual array coordinates of the plurality of exposure areas from design array coordinates of the plurality of exposure areas, the array coordinates of the alignment marks measured at the first step, and the reliability value determined at the second step with respect to each of the array coordinates of the alignment marks. On the basis of the array coordinates estimated at the third step, the plurality of exposure areas are each sequentially aligned with respect to the predetermined reference position (Step 105).

In this case, a first method of quantifying a confidence level at the second step is as follows: Assuming that the number of array coordinates measured at the first step is N (N is an integer of 3 or more), actual array coordinates of (N−1) array coordinates are estimated by a linear approximation calculation using the measurement results of the (N−1) array coordinates, excluding the i-th array coordinate (i is an integer of from 1 to N), together with design array coordinates on the wafer (W). A dispersion (standard deviation) of a difference between each of the estimated (N−1) array coordinates and the corresponding array coordinate measured at the first step is obtained. Then, a reliability value is added to the measurement result of the i-th array coordinate in such a way that, when the dispersion is large, the reliability value is high, whereas, when the dispersion is small, the reliability value is low.

A second method for quantifying a confidence level at the second step is as follows: Assuming that the number of array coordinates measured at the first step is N (N is an integer of 3 or more), an actual array coordinate of the i-th array coordinate (i is an integer of from 1 to N) is estimated by a linear approximation calculation using the measurement results of (N−1) array coordinates, excluding the measurement result of the i-th array coordinate, together with design array coordinates on the wafer (W). A size of a difference between the estimated array coordinate and the corresponding array coordinate measured at the first step is obtained. Then, a reliability value is added to the measurement result of the i-th array coordinate in such a way that, when the difference is small, the reliability value is high, whereas, when the difference is large, the reliability value is low.

In the above-described methods, the third step may be carried out as follows: When the number of array coordinates measured at the first step is N (N is an integer of 3 or more), assuming that the reliability value of i-th array coordinate (i is an integer of from 1 to N) obtained at said second step are $h_i$, N calculated array coordinates is obtained by performing a coordinate transformation of design array coordinates of exposure areas to be measured on said substrate using a predetermined coordinate transformation parameter to determine said predetermined coordinate transformation parameter so that a sum of respective products of the γ-th power (γ is a real number not less than zero) of said reliability value $h_i$, which is a weight, and the squares of the difference between said N calculated array coordinates and corresponding N array coordinates measured at said first step reaches a minimum. Then, actual array coordinates of the plurality of exposure areas are estimated by a calculation using the determined coordinate transformation parameters and the design array coordinates of the plurality of exposure areas.

According to the present invention, arranged as described above, a confidence level or reliability value is quantified with respect to each of a plurality of measured array coordinates on the basis of only the actual measurement results, not on the basis of the intensity, bilateral symmetry or other condition of the detection signal obtained during the detection of alignment mark positions. In this case, most of the measured values of a plurality of array coordinates are usually reliable. Therefore, it is possible to quantify a reliability value for each measured value by taking notice of each individual measured value without depending on the intensity, bilateral symmetry or other condition of the detection signal. By performing an approximation calculation which is weighted on the basis of the reliability value, an extremely light weight is added to a measured value which is entirely jump data, whereas a heavy weight is added to a reliable measuring point. With respect to a measuring point for which no definite reliability value can be determined, an intermediate weight is added. Consequently, it is possible to expect a higher degree of accuracy in comparison to the conventional method in which jump data is simply excluded.

Regarding the above-described first method for quantifying a confidence level or reliability value at the second step of the present invention, let us assume that only the measurement result of the i-th array coordinate is jump data. In this case, for example, a linear coordinate approximation calculation is performed by using (N-1) measurement results, excluding the i-th measurement result, and in the new coordinate system thus obtained, (N-1) differences between the calculated array coordinates and the actual measurement results are obtained at the respective measuring points. Further, a standard deviation in the differences is determined. At this time, the standard deviation is small because no jump data is contained in the measurement results except the i-th measurement result. On the other hand, if a similar calculation is performed by using (N-1) array coordinates obtained by subtracting one array coordinate other than the i-th array coordinate from N array coordinates, the standard deviation is large because the i-th measurement result, which is jump data, is contained in the measurement results of the (N-1) array coordinates. In other words, the standard deviation obtained by the above-described method is characterized in that it is small when jump data is excluded, but large when a measurement result which is not jump data is excluded. Accordingly, the size of the standard deviation can be related directly to the size of the reliability value.

Regarding the above-described second method for quantifying a confidence level or reliability value, in a case where the i-th measurement result is jump data, if a linear approximation calculation is performed, for example, by using (N-1) measurement results, excluding the i-th measurement result, there is a large difference between the calculated position of the i-th measuring point in the coordinate system obtained by the approximation calculation and the actual measurement result. Conversely, if the i-th measurement result is not jump data, the difference is small. Accordingly, when the difference is large, the reliability value for the i-th measurement result is determined to be low (i.e. the weight is reduced), whereas, when the difference is small, the reliability value is determined to be high (i.e. the weight is increased), thereby enabling the reliability value to be accurately quantified.

DESCRIPTION OF THE PREFERRED EMBODIMENTS

One embodiment of the alignment method according to the present invention will be described below with reference to the accompanying drawings. In the following embodiment, the present invention is applied to a stepper type projection exposure apparatus, in which a reticle pattern is transferred to each shot area on a wafer, to effect alignment of each shot area on the wafer.

Figure 2:
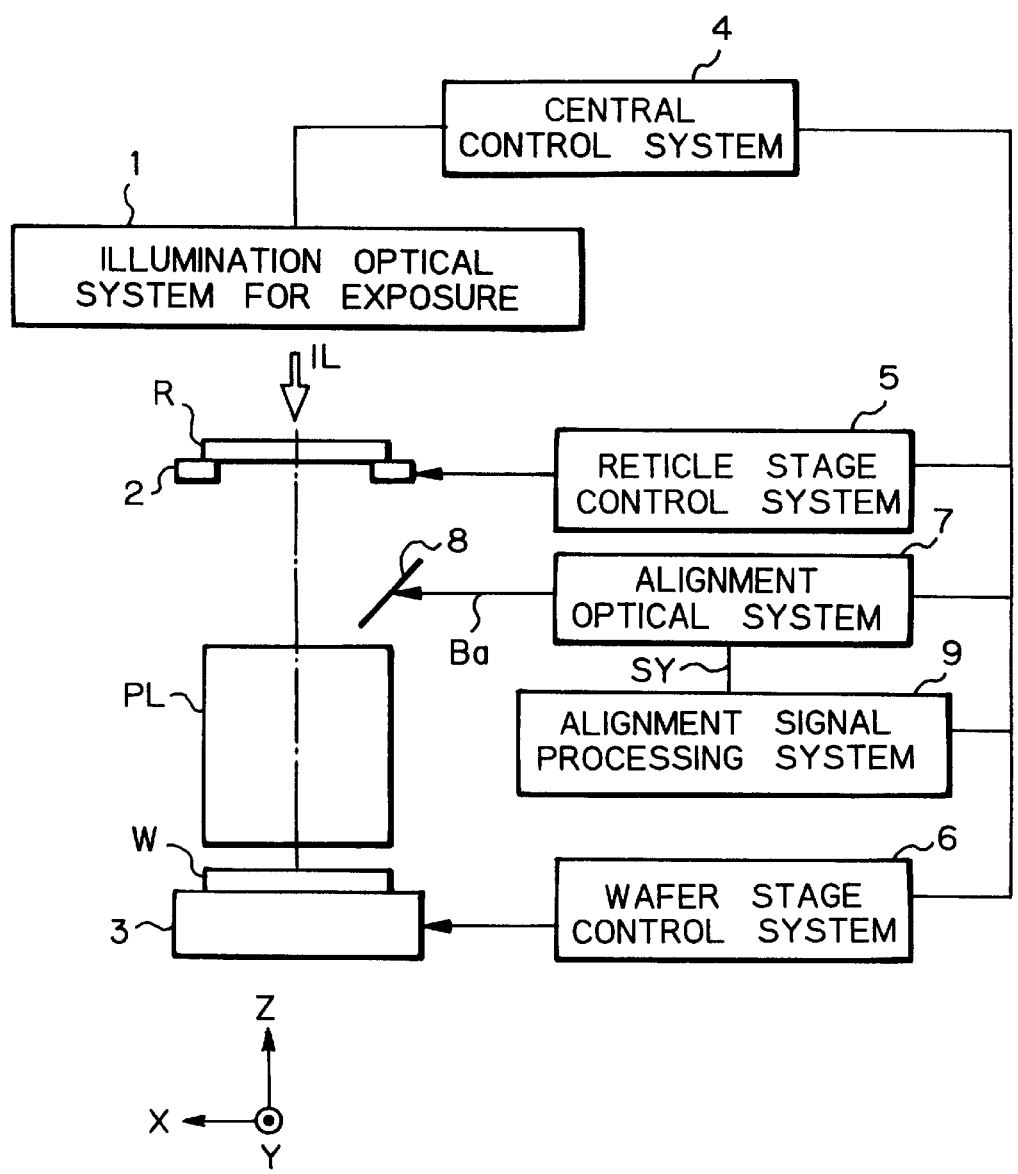
FIG. 2 is a block diagram showing the whole arrangement of a projection exposure apparatus used in the embodiment.

FIG. 2 shows the system configuration of a projection exposure apparatus used in this embodiment. Referring to FIG. 2, when exposure is to be carried out, exposure light IL from an illumination optical system 1 for exposure illuminates a reticle R, and under the exposure light IL, a pattern formed on the reticle R is transferred to each shot area on a wafer W coated with a photoresist with its size (length) being reduced to ⅕, for example, by a projection optical system PL. In this embodiment, a Z-axis is taken in a direction parallel to an optical axis of the projection optical system PL, and an X-axis is taken in a direction parallel to the plane of FIG. 2 in a plane perpendicular to the Z-axis. Further, a Y-axis is taken in a direction perpendicular to the plane of FIG. 2. The reticle R is held on a reticle stage 2 which can slightly move the reticle R in the directions X and Y and also in a rotational direction (direction θ). The wafer W is held on a wafer stage 3 which positions the wafer W three-dimensionally.

Figure 3:
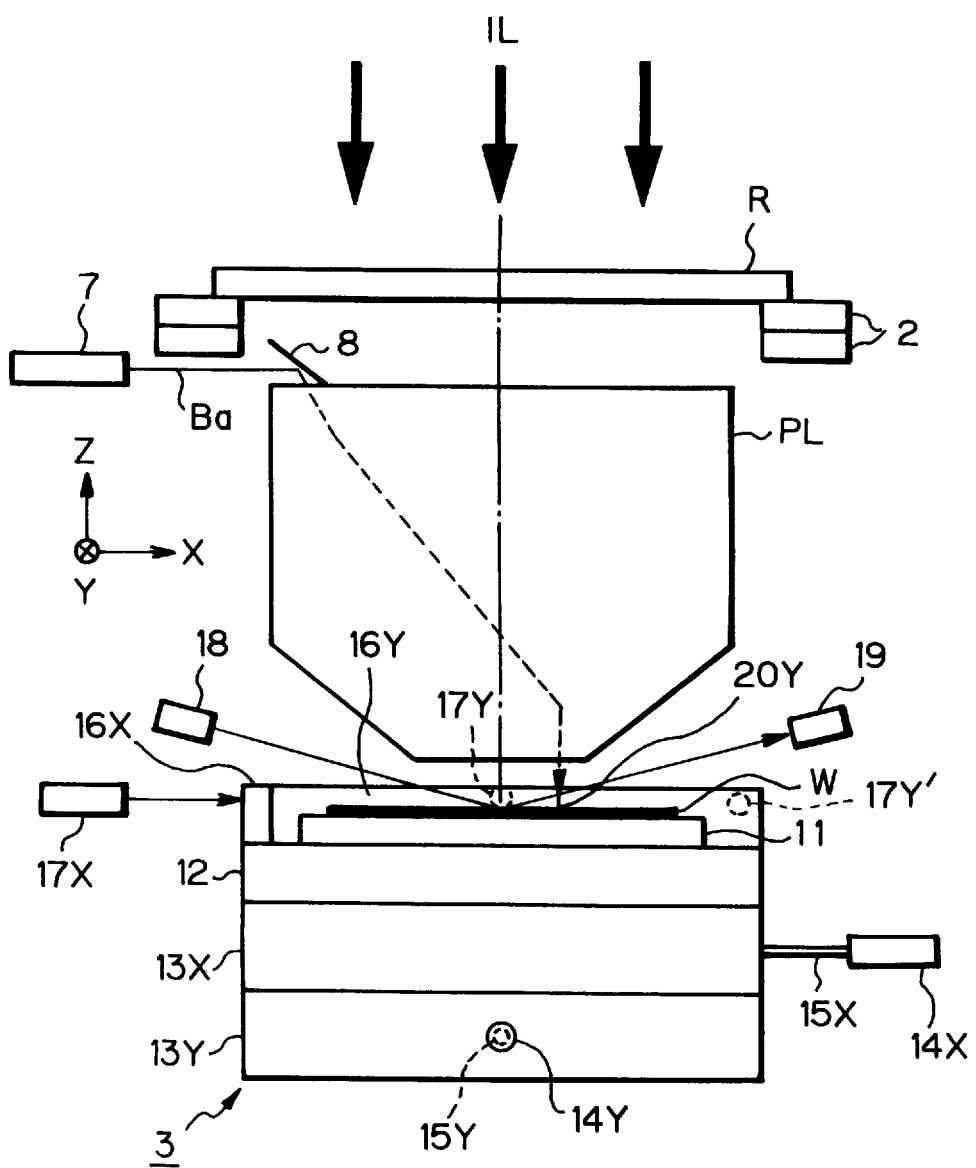
FIG. 3 shows the arrangement of an essential part of a mechanical section of the projection exposure apparatus used in the embodiment.

FIG. 3 shows an essential part of the mechanical section of the projection exposure apparatus shown in FIG. 2. In the wafer stage 3 shown in FIG. 3, the wafer W is held on a wafer holder 11 by vacuum suction. The wafer holder 11 is fixed on a Z-tilt stage 12 which is movable in the direction Z and also tiltable within a predetermined range. The Z-tilt stage 12 is mounted on an X-stage 13X which is movable in the direction X. The X-stage 13X is mounted on a Y-stage 13Y which is movable in the direction Y on a base (not shown). The Y-stage 13Y is driven to move in the direction Y by rotating a feed screw 15Y with a drive motor 14Y. The X-stage 13X is driven to move in the direction X by rotating a feed screw 15X with a drive motor 14X.

A movable mirror 16X is fixed on an end portion of the Z-tilt stage 12. The movable mirror 16X has a reflecting surface which is approximately perpendicular to the X-axis. The movable mirror 16X cooperates with an external laser interferometer 17X to monitor the X-coordinate of the Z-tilt stage 12 at all times at a resolution of the order of 0.01 μm, for example. Further, a movable mirror 16Y is fixed on another end portion of the Z-tilt stage 12. The movable mirror 16Y has a reflecting surface which is approximately perpendicular to the Y-axis. The movable mirror 16Y cooperates with two external laser interferometers 17Y and 17Y' to monitor the Y-coordinate and rotational angle of the Z-tilt stage 12 at all times. A coordinate system comprising the X- and Y-coordinates of the Z-tilt stage 12 (and hence the wafer W), which are measured with the laser interferometers 17X, 17Y and 17Y', will be hereinafter referred to as "stage coordinate system (X,Y)".

In addition, a light-emitting system 18 and a light-receiving system 19 are disposed above the wafer stage 3 so as to constitute an auto-focus sensor for measuring the Z-coordinate of the wafer W. More specifically, the light-emitting system 18 projects a slit image onto a measuring point on the wafer W in the center of an exposure field of the projection optical system PL obliquely to the optical axis of the projection optical system PL, and reflected light from the slit image enters the light-receiving system 19 to re-form the slit image on a photoelectric detector via an oscillating mirror, for example. Further, a detection signal from the photoelectric detector is synchronously rectified by using the oscillating mirror driving signal, thereby obtaining a focus signal. The focus signal changes approximately linearly within a predetermined range with respect to the displacement in the direction Z of the wafer W. Accordingly, the wafer W can be focused by an autofocus method with respect to the projection optical system PL at all times by driving the Z-tilt stage 12 so that the focus signal assumes a predetermined value.

Referring to FIG. 2, a central control system 4, which controls the whole system, is supplied with coordinate signals (X,Y) regarding the wafer stage 3 (i.e. the coordinates in the stage coordinate system) measured by the laser interferometers 17X and 17Y, and the focus signal from the auto-focus sensor. The central control system 4 controls the positioning operation of the wafer stage 3 through a wafer stage control system 6 on the basis of the coordinate and focus signals supplied thereto, thereby automatically focusing the wafer W. Similarly, signals regarding the coordinates of the reticle stage 2 which are measured by laser interferometers (not shown) are also supplied to the central control system 4. The central control system 4 controls the positioning operation of the reticle stage 2 through a reticle stage control system 5 on the basis of the coordinate signals supplied thereto. Upon completion of exposure with respect to a first shot area on the wafer W, a subsequent shot area on the wafer W is set to the exposure position by the stepping operation of the wafer stage 3. In this manner, exposure is carried out with respect to each shot area on the wafer W by the step-and-repeat method.

It is necessary in order to carry out the above-described exposure process to obtain the array coordinates in the stage coordinate system (X,Y) of each shot area on the wafer W in advance. For this purpose, it is necessary to measure the coordinates in the stage coordinate system (X,Y) of a predetermined number of alignment marks (wafer marks) on the wafer W. As an alignment sensor for the coordinate measurement, an alignment sensor based on both the TTL (Through-The-Lens) alignment method and the laser step alignment method (hereinafter referred to as "LSA method" is used in this embodiment.

First, one example of wafer marks used in the case of the LSA method will be explained.

Figure 4:
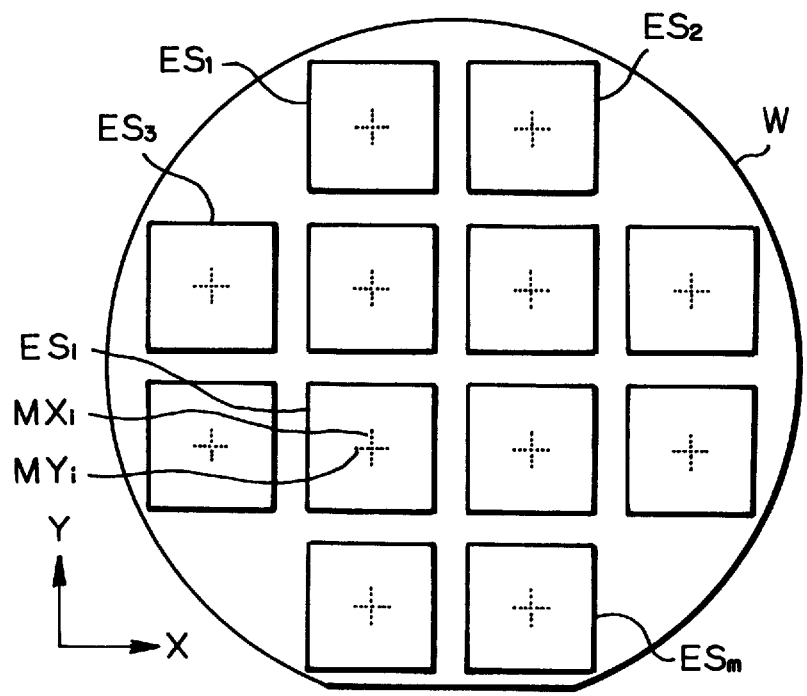
FIG. 4 is a plan view showing one example of an array of shot areas on a wafer.

FIG. 4 shows a wafer W which is to be exposed in this embodiment. Referring to FIG. 4, the surface of the wafer W is formed with m shot areas $ES_1$, $ES_2$, ... $ES_m$ (m is an integer of 3 or more) at a predetermined pitch in both the directions X and Y. In each shot area $ES_i$ (i=1 to m), a predetermined circuit pattern has already been formed by a process previously carried out. Further, each shot area $ES_i$ has an LSA type wafer mark $MX_i$ for the X-axis and an LSA type wafer mark $MY_i$ for the Y-axis, which are provided in association with the circuit pattern formed therein.

It should be noted that, in FIG. 4, the wafer marks $MX_i$ and $MY_i$ are formed at the center point in the shot area $ES_i$; therefore, the coordinates (X,Y) of the wafer marks $MX_i$ and $MY_i$ can be regarded as the array coordinates of the shot area $ES_i$. However, in actual practice, wafer marks may be formed in other areas, for example, a street line area between a pair of adjacent shot areas. In such a case, a preset offset value is added to the measured coordinate values of the wafer marks, and the resulting coordinate values are defined as the array coordinates of the center point of the corresponding shot area. Further, although in the example shown in FIG. 4 each shot area $ES_i$ is provided with a pair of one-dimensional wafer marks (or one two-dimensional wafer mark), it should be noted that each shot area $ES_i$ may be provided with three or more one-dimensional wafer marks (or two or more two-dimensional wafer marks). By increasing the number of wafer marks in this way, it is also possible to detect a scaling (linear expansion or contraction), rotation angle, etc. of the circuit pattern in each shot area.

Figure 5:
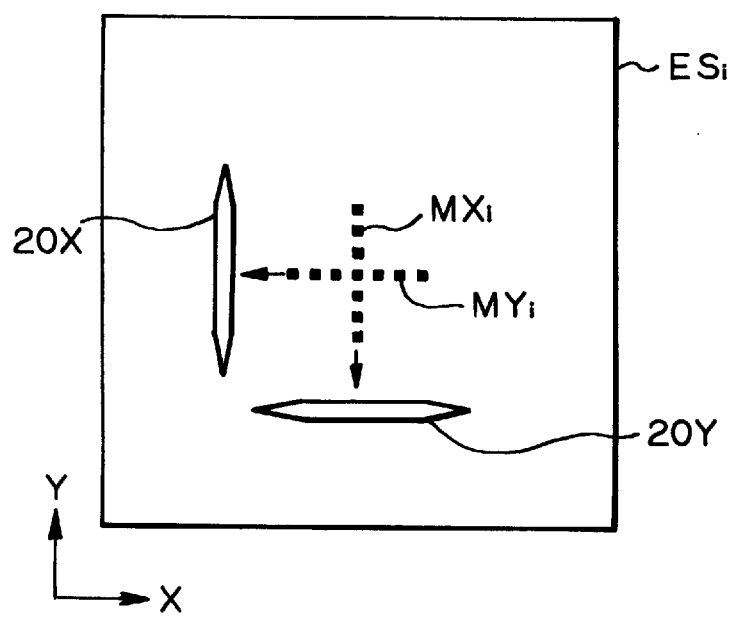
FIG. 5 is an enlarged plan view showing one shot area on the wafer, together with wafer marks attached thereto.

FIG. 5 is an enlarged view of the wafer marks $MX_i$ and $MY_i$. Referring to FIG. 5, the wafer mark $MX_i$ for the X-axis is a grating-shaped pattern comprising small square patterns which are arrayed at a predetermined pitch in the direction Y. The wafer mark $MY_i$ for the Y-axis is a grating-shaped pattern comprising small square patterns which are arrayed at a predetermined pitch in the direction X.

The LSA type alignment sensor in this embodiment comprises, as shown in FIG. 2, an alignment optical system 7, a mirror 8, and an alignment signal processing system 9. It should be noted that the alignment optical system 7 is an optical system for the Y-axis, and that an optical system for the X-axis is also provided separately from the alignment optical system 7.

To detect the position of the wafer mark $MY_i$ for the Y-axis in the shot area $ES_i$ shown in FIG. 5, for example, the alignment optical system 7, shown in FIG. 3, emits a laser beam Ba having a wave band to which the photoresist on the wafer W is non-sensitive or less sensitive. The laser beam Ba is reflected by the mirror 8, which is disposed between the reticle stage 2 and the projection optical system PL, to enter the projection optical system PL. The laser beam Ba having passed through the projection optical system PL is converged onto a slit-shaped illumination area 20Y on the wafer W which is elongated in the direction X. By driving the wafer stage 3 in this state, as shown in FIG. 5, the wafer mark $MY_i$ is scanned in the direction Y relative to the illumination area 20Y. When the illumination area 20Y and the wafer mark $MY_i$ overlap each other in the direction Y (measuring direction), diffracted light is generated from the wafer mark $MY_i$.

Figure 6:
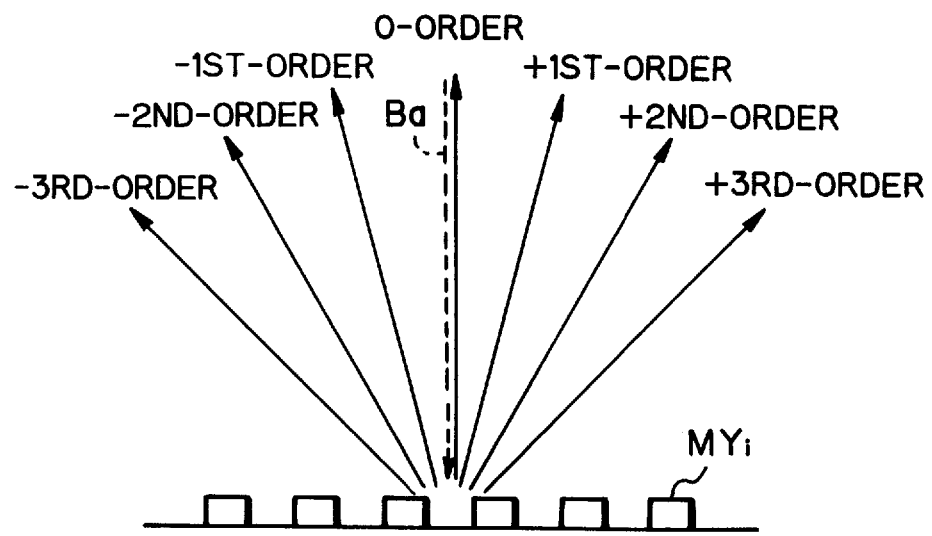
FIG. 6 illustrates the detection principle of an LSA type alignment sensor.

FIG. 6 shows diffracted light rays generated from the wafer mark $MY_i$. In FIG. 6, when the laser beam Ba is incident on the wafer mark $MY_i$ at substantially right angles to the wafer surface, zeroth-order diffracted light returns parallel to the laser beam Ba, and ±1st-order diffracted light, ±2nd-order diffracted light, ±3rd-order diffracted light, etc. are emitted at respective predetermined diffraction angles with respect to the pitch direction (direction of arrangement of square patterns of the wafer mark $MY_i$. These diffracted light rays return to the alignment optical system 7 through the projection optical system PL and via the mirror 8 in the system shown in FIG. 2. As is technically known in the art, the alignment optical system 7 includes a spatial filter (not shown) for selecting only diffracted lights of specific orders, i.e. ±1st-order to ±3rd-order diffracted lights, and a photoelectric detector (not shown) for receiving the selected diffracted light. The diffracted light is photoelectrically converted by the photoelectric detector to obtain a detection signal SY, which is supplied to the alignment signal processing system 9. The alignment signal processing system 9 is also supplied with coordinate values measured by the laser interferometers 17X, 17Y, etc. provided for the wafer stage 3. The alignment signal processing system 9 converts the supplied detection signal SY into digital form by analog-to-digital (A/D) conversion, and sequentially stores the digital detection signal SY in its internal memory in association with the Y-coordinate of the wafer stage 3 at that time.

Figure 7:
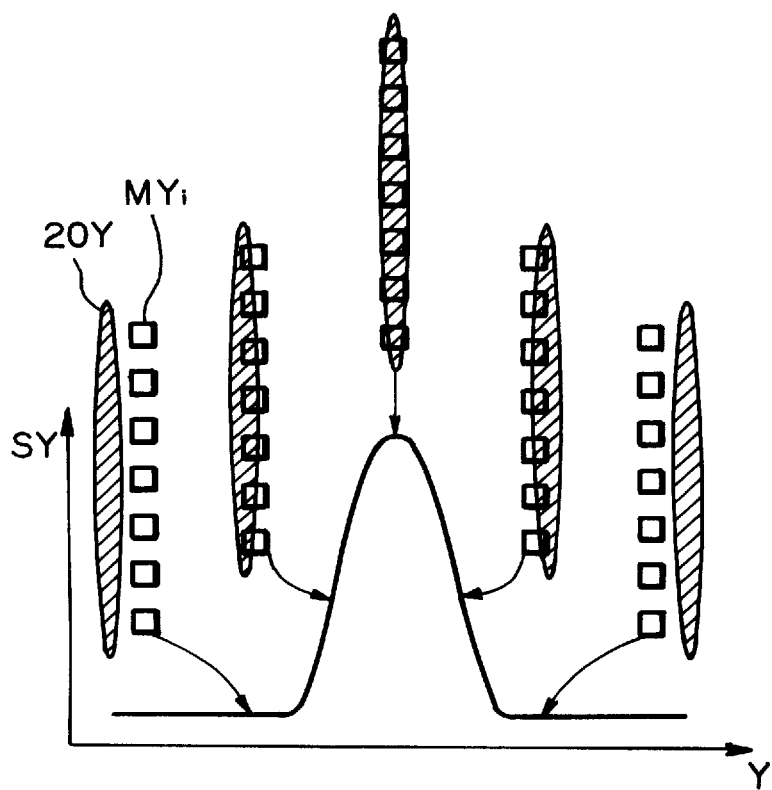
FIG. 7 shows a detection signal output from an LSA type alignment sensor.

FIG. 7 shows one example of the detection signal SY stored in the internal memory of the alignment signal processing system 9 in association with the Y-coordinate when the wafer mark for the Y-axis is scanned in the direction Y relative to the laser beam. As shown in FIG. 7, every time the Y-coordinate of the wafer stage 3, which is measured by the laser interferometer, changes by a predetermined quantity, the detection signal SY is A/D converted, and the digital detection signal SY is stored in the memory. FIG. 7 also shows the positional relationship between the illumination area 20Y illuminated by the laser beam Ba and the grating-shaped wafer mark $MY_i$ at predetermined positions in the direction Y.

In this case, when the positional relationship between the illumination area 20Y and the wafer mark $MY_i$ is such as that shown at the left end as viewed in FIG. 7, the illumination area 20Y and the wafer mark $MY_i$ have not yet overlapped each other. Therefore, only zeroth-order diffracted light is generated, and the level of the detection signal SY is approximately zero (noise level). As the wafer stage 3 moves, the illumination area 20Y and the wafer mark $MY_i$ gradually overlap each other, and the intensity of the detection signal SY gradually increases. After the wafer mark $MY_i$ has passed the center of the illumination area 20Y, the intensity of the detection signal SY gradually decreases. In detection of the coordinate of the wafer mark $MY_i$, for example, the alignment signal processing system 9 slices the detection signal SY at an appropriate level, obtains the Y-coordinates of two points of intersection, and determines the intermediate coordinate between the two coordinates to be the Y-coordinate of the wafer mark $MY_i$.

Similarly, a laser beam from an alignment optical system (not shown) for the X-axis is, as shown for example in FIG. 5, converged on a slit-shaped illumination area 20X which is elongated in the direction Y in the vicinity of the wafer mark $MX_i$ for the X-axis. As the wafer mark $MX_i$ is scanned in the direction X relative to the illumination area 20X by driving the wafer stage 3, a detection signal similar to that shown in FIG. 7 is output from the alignment optical system for the X-axis. The detection signal is processed in the alignment signal processing system 9 to obtain the X-coordinate of the wafer mark $MX_i$. An amount of deviation of a coordinate value detected in this way from a predetermined design array coordinate is supplied to the central control system 4, shown in FIG. 2, as alignment data. The central control system 4 effects alignment on the basis of the supplied alignment data concerning each wafer mark by a novel method in which a predetermined reliability value or confidence level is introduced into the conventional EGA (Enhanced Global Alignment) method, as described later.

Next, one example of the alignment and exposure operation in this embodiment will be explained with reference to the flowchart of FIG. 1.

Figure 1:
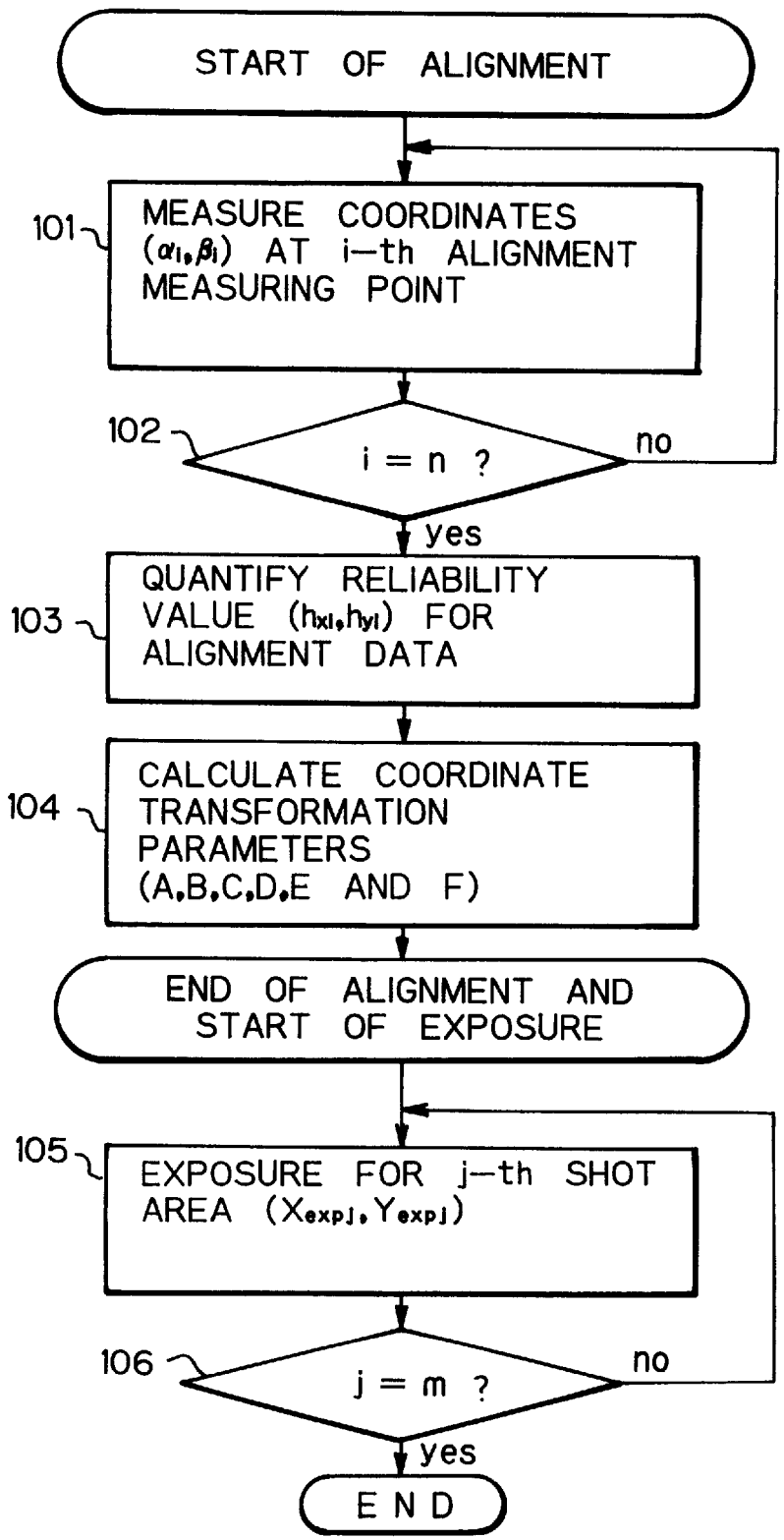
FIG. 1 is a flowchart showing one embodiment of the alignment method according to the present invention.

First, at Steps 101 and 102 in FIG. 1, the coordinates in the stage coordinate system (X,Y) of wafer marks which indicate the positions of n measuring points (alignment measuring points; n is an integer of 3 or more) on the wafer W in FIG. 4 are measured. In this embodiment, n alignment measuring points are selected by a method in which n shot areas (sample shots) have previously been selected from among m shot areas $ES_1$ to $ES_m$ on the wafer W and determined as sample shots, and the center points in the n sample shots are defined as alignment measuring points. In this case, wafer marks $MX_j$ (j is an integer from 1 to m) which indicate the X-coordinates of the alignment measuring points and wafer marks $MY_j$ which indicate the Y-coordinates of the alignment measuring points are objects to be measured.

It should be noted that it is not always necessary to measure both the X- and Y-coordinates of each alignment measuring point. For example, the arrangement may be such that only the wafer mark for the X-axis (X-coordinate) is measured at one alignment measuring point, and only the wafer mark for the Y-axis (Y-coordinate) is measured at another alignment measuring point. In this embodiment, however, it is necessary to determine values for k transformation parameters (k is 6, for example), as will be described alter. Therefore, it is necessary to measure the positions of at least k one-dimensional wafer marks in total. When two or more one-dimensional wafer marks (or two or more two-dimensional wafer marks) are provided in each shot area, as has already been described, it is also only necessary to measure at least one wafer mark for each sample shot.

In this embodiment, the design array coordinates of pairs of wafer marks indicating n alignment measuring points are assumed to be $(x_1,y_1), (x_2,y_2), \ldots, (x_i,y_i), \ldots, (x_n,y_n)$. The design array coordinates $(x_i,y_i)$ (i=1 to n) are obtained, for example, by transforming the initial values of the design array coordinates in a sample coordinate system defined on the wafer W into the array coordinates in the stage coordinate system by using transformation parameters obtained during pre-alignment of the wafer W.

Therefore, when the coordinates of the wafer marks for the i-th alignment measuring point are to be measured, scanning is effected by driving the wafer stage 3, shown in FIG. 3, so that a point which is determined by the design array coordinates $(x_i,y_i)$ crosses either the illumination area 20X or 20Y, shown in FIG. 5. The alignment signal processing system 9, shown in FIG. 2, obtains the array coordinates of a pair of wafer marks from the detection signal supplied from the alignment optical system 7. Thereafter, the alignment signal processing system 9 obtains an amount of deviation $(\alpha_i, \beta_i)$ of the determined array coordinates from the design array coordinates $(x_i,y_i)$, and supplies the amount of deviation to the central control system 4 as alignment data. Accordingly, the central control system 4 is supplied with alignment data $(\alpha_1,\beta_1), (\alpha_2,\beta_2), \ldots, (\alpha_i,\beta_i), \ldots, (\alpha_n,\beta_n)$ corresponding to the n alignment measuring points, respectively.

In other words, the sums of the alignment data and the design array coordinates, i.e. $(x_1+\alpha_1,y_1+\beta_1), (x_2+\alpha_2,y_2+\beta_2), \ldots, (x_i+\alpha_i,y_i+\beta_i), \ldots, (x_n+\alpha_n,y_n+\beta_n)$, are the array coordinates of the wafer marks actually measured in the stage coordinate system. However, the alignment data contain measurement errors due to an alignment sensor detection error, deformation of wafer marks, etc. Therefore, the control process in FIG. 1 proceeds to Step 103, at which the central control system 4 quantifies a reliability value or confidence level for each alignment data.

For this purpose, first, calculated array coordinates $(X_1, Y_1), (X_2,Y_2), \ldots, (X_i,Y_i), \ldots, (X_n,Y_n)$ at which the wafer marks are estimated to be actually existent (hereinafter referred to as "existence coordinates") are obtained from alignment data by an approximation calculation. In this regard, the wafer W is not always accurately placed on the wafer stage 3; therefore, it is assumed that the following relational expression is set between the design array coordinates and the existence coordinates on account of parallel shifts $(O_x, O_y)$ in the directions X and Y, rotation $\theta$ of the X-axis in the XY-plane, rotation $\phi$ of the Y-axis in the XY-plane, expansion or contraction $(s_x, y_y)$ of the wafer itself, etc.:

$$\begin{pmatrix} X_i \\ Y_i \end{pmatrix} = \begin{pmatrix} 1+s_x & 0 \\ 0 & 1+s_y \end{pmatrix} \begin{pmatrix} \cos\theta & -\sin\phi \\ \sin\theta & \cos\phi \end{pmatrix} \begin{pmatrix} x_i \\ y_i \end{pmatrix} + \begin{pmatrix} o_x \\ o_y \end{pmatrix} \quad (1)$$

In Eq. 1, if $\cos\theta$ and $\cos\phi$ are both approximated at 1, and $\sin\theta$ and $\sin\phi$ are approximated to be $\theta$ and $\phi$, respectively, and further the second order terms of $s_x$, $s_y$, $\theta$ and $\phi$ are regarded as zero, the following equation 2 is obtained:

$$\begin{pmatrix} X_i \\ Y_i \end{pmatrix} = \begin{pmatrix} 1+s_x & -\phi \\ \theta & 1+s_y \end{pmatrix} \begin{pmatrix} x_i \\ y_i \end{pmatrix} + \begin{pmatrix} o_x \\ o_y \end{pmatrix} \quad (2)$$

On the other hand, if alignment data as obtained when no error is supposed to be involved in the measurement of the coordinates of the wafer marks, that is, ideal measured values, are assumed to be $(\alpha_{M1}, \beta_{M1})$, $(\alpha_{M2}, \beta_{M2})$, . . . , $(\alpha_{Mi}, \beta_{Mi})$, . . . , $(\alpha_{Mn}, \beta_{Mn})$, the relationship expressed by the following equation 3 holds between the design array coordinates $(x_i, y_i)$ and the existence coordinates $(X_i, Y_i)$:

$$\begin{pmatrix} X_i \\ Y_i \end{pmatrix} = \begin{pmatrix} x_i \\ y_i \end{pmatrix} + \begin{pmatrix} \alpha M_i \\ \beta M_i \end{pmatrix} \quad (3)$$

From Eqs. 2 and 3, the relationship between the design array coordinates $(x_i, y_i)$ and the ideal measured values $(\alpha_{Mi}, \beta_{Mi})$ is expressed by the following equation 4:

$$\begin{pmatrix} \alpha M_i \\ \beta M_i \end{pmatrix} = \begin{pmatrix} s_x & -\phi \\ \theta & s_y \end{pmatrix} \begin{pmatrix} x_i \\ y_i \end{pmatrix} + \begin{pmatrix} o_x \\ o_y \end{pmatrix} \quad (4)$$

For the sake of simplicity, the elements of the matrix with 2 rows and 2 columns on the right-hand side of Eq. 4 are replaced by six transformation parameters A, B, C, D, E and F to obtain the following equation 5:

$$\begin{pmatrix} \alpha M_i \\ \beta M_i \end{pmatrix} = \begin{pmatrix} A & B \\ C & D \end{pmatrix} \begin{pmatrix} x_i \\ y_i \end{pmatrix} + \begin{pmatrix} E \\ F \end{pmatrix} \quad (5)$$

In this case, the following relationships are held: $A=s_x$; $B=-\phi$; $C=\theta$; $D=s_y$; $E=O_x$; and $F=O_y$. In order to obtain values of the six transformation parameters A to F, a confidence level is quantified for each alignment data. For this purpose, first, values of the six transformation parameters A to F are obtained by a least square approximation calculation on the basis of (n−1) alignment data obtained by excluding the first alignment data from the n alignment data. More specifically, with respect to the n alignment data $(\alpha_i, \beta_i)$, exclusive of the alignment datum corresponding to the alignment measuring point of i=1, differences between the above-described ideal measured values $(\alpha_{Mi}, \beta_{Mi})$ and the alignment data $(\alpha_i, \beta_i)$ are squared, and the (n−1) squares are added together. The sum of squares is denoted by $(\epsilon_{x1}, \epsilon_{y1})$, which is expressed in vector form as follows:

Eq. 6 is partially differentiated with respect to each of the six transformation parameters A, B, C, D, E and $$\begin{pmatrix} \epsilon_{x1} \\ \epsilon_{y1} \end{pmatrix} = \begin{pmatrix} \sum_{i=2}^{n}(\alpha_i - \alpha M_i)^2 \\ \sum_{i=2}^{n}(\beta_i - \beta M_i)^2 \end{pmatrix} = \begin{pmatrix} \sum_{i=2}^{n}(\alpha_i - Ax_i - By_i - E)^2 \\ \sum_{i=2}^{n}(\beta_i - Cx_i - Dy_i - F)^2 \end{pmatrix} \quad (6)$$

F and set equal to zero, thereby setting up six simultaneous equations, from which six transformation parameter values $A_1, B_1, C_1, D_1, E_1,$ and $F_1$ are obtained as expressed by the following equations 7 and 8:

$$\begin{pmatrix} A_1 \\ B_1 \\ E_1 \end{pmatrix} = \begin{pmatrix} \sum_{\text{excluding } i=1} x_i & \sum y_i & n \\ \sum x_i^2 & \sum x_i y_i & \sum x_i \\ \sum x_i y_i & \sum y_i^2 & \sum y_i \end{pmatrix}^{-1} \begin{pmatrix} \sum \alpha_i \\ \sum \alpha_i x_i \\ \sum \alpha_i y_i \end{pmatrix} \quad (7)$$

$$\begin{pmatrix} C_1 \\ D_1 \\ F_1 \end{pmatrix} = \begin{pmatrix} \sum_{\text{excluding } i=1} x_i & \sum y_i & n \\ \sum x_i^2 & \sum x_i y_i & \sum x_i \\ \sum x_i y_i & \sum y_i^2 & \sum y_i \end{pmatrix}^{-1} \begin{pmatrix} \sum \beta_i \\ \sum \beta_i x_i \\ \sum \beta_i y_i \end{pmatrix} \quad (8)$$

Next, a reliability value for the first alignment data $(\alpha_i, \beta_i)$ is quantified. That is, the six transformation parameter values $A_1$ to $F_1$ obtained from Eqs. 7 and 8 are substituted into the transformation parameters A to F in Eq. 5, respectively, to obtain array coordinates. Then, differences between the array coordinates and the actually measured alignment data are squared, and the resulting squares are added together in a range in which the value of the subscript i is from 2 to n, to obtain a sum $(h_{x1}, h_{y1})$, which is defined as a reliability value for the first alignment datum $(\alpha_i, \beta_i)$. Accordingly, the reliability value $(h_{x1}, h_{y1})$ is expressed by the following equation 9:

$$\begin{pmatrix} h_{x1} \\ h_{y1} \end{pmatrix} = \begin{pmatrix} \sum_{\text{excluding } i=1}(\alpha_i - A_1 x_i - B_1 y_i - E_1)^2 \\ \sum_{\text{excluding } i=1}(\beta_i - C_1 x_i - D_1 y_i - F_1)^2 \end{pmatrix} \quad (9)$$

Subsequently, a calculation similar to that in the above-described process is performed by using (n−1) alignment data, excluding the second alignment datum, thereby obtaining values $A_2, B_2, C_2, D_2, E_2,$ and $F_2$ of the six transformation parameters A to F. By using the values $A_2$ to $F_2$, a calculation similar to that in the above-described process is performed to obtain a reliability value or confidence level $(h_{x2}, h_{y2})$ for the second alignment data item $(\alpha_2, \beta_2)$.

Thereafter, a reliability value for each of the third and later alignment data is similarly obtained, and thus the reliability values $(h_{x1}, h_{y1})$ to $(h_{xn}, h_{yn})$ for all the alignment data $(\alpha_1, \beta_1)$ to $(\alpha_n, \beta_n)$ are determined.

Next, at Step 104, the values of the transformation parameters A to F, which are to be used to calculate the array coordinates of each shot area $ES_j$ (j=1 to M) on the wafer W, are calculated on the basis of the reliability value for alignment data quantified at Step 103. For this purpose, with respect to each of the n alignment data $(\alpha_i, \beta_i)$ (i=1 to n), a difference between the ideal measured value $(\alpha_{Mi}, \beta_{Mi})$ and the alignment data $(\alpha_i, \beta_i)$ is squared, and the resulting square is multiplied by the confidence level $(h_{xi}, h_{yi})$ obtained at Step 103. The products thus obtained are added together in a range in which the value of the subscript i is from 1 to n, and the resulting sum is defined as a residual error component $(\epsilon_x, \epsilon_y)$. This means that a weighted residual error component $(\epsilon_x, \epsilon_y)$ is obtained as shown by the following equation 10 with the reliability value $(h_{xi}, h_{yi})$ used as a weight added to the i-th alignment datum:

$$\begin{pmatrix} \epsilon_x \\ \epsilon_y \end{pmatrix} = \begin{pmatrix} \sum_{i=1}^{n} h_{xi}(\alpha_i - \alpha M_i)^2 \\ \sum_{i=1}^{n} h_{yi}(\beta_i - \beta M_i)^2 \end{pmatrix} = \begin{pmatrix} \sum_{i=1}^{n} h_{xi}(\alpha_i - Ax_i - By_i - E)^2 \\ \sum_{i=1}^{n} h_{yi}(\beta_i - Cx_i - Dy_i - F)^2 \end{pmatrix} \quad (10)$$

Thereafter, the residual error component is partially differentiated with respect to each of the six transformation parameters A, B, C, D, E and F and set equal to zero, thereby setting up six simultaneous equations, from which six transformation parameter values A, B, C, D, E and F are obtained as expressed by the following equations 11 and 12:

$$\begin{pmatrix} A \\ B \\ E \end{pmatrix} = \begin{pmatrix} \sum_{i=1}^{n} h_{xi}x_i & \sum h_{xi}y_i & \sum h_{xi} \\ \sum h_{xi}x_i^2 & \sum h_{xi}x_iy_i & \sum h_{xi}x_i \\ \sum h_{xi}x_iy_i & \sum h_{xi}y_i^2 & \sum h_{xi}y_i \end{pmatrix}^{-1} \begin{pmatrix} \sum h_{xi}\alpha_i \\ \sum h_{xi}\alpha_i x_i \\ \sum h_{xi}\alpha_i y_i \end{pmatrix} \quad (11)$$

$$\begin{pmatrix} C \\ D \\ F \end{pmatrix} = \begin{pmatrix} \sum_{i=1}^{n} h_{yi}x_i & \sum h_{yi}y_i & \sum h_{yi} \\ \sum xh_{yii}^2 & \sum h_{yi}x_iy_i & \sum h_{yi}x_i \\ \sum h_{yi}x_iy_i & \sum h_{yi}y_i^2 & \sum h_{yi}y_i \end{pmatrix}^{-1} \begin{pmatrix} \sum h_{yi}\beta_i \\ \sum h_{yi}\beta_i x_i \\ \sum h_{yi}\beta_i y_i \end{pmatrix} \quad (12)$$

As a result, it is found that the design array coordinates $(x_i,y_i)$ of the i-th alignment measuring point and the coordinates (existence coordinates) $(X_i,Y_i)$, at which the wafer marks are estimated to be actually existent, are related to each other as expressed by the following equation 13 by using the six parameters A to F obtained from Eqs. 11 and 12:

$$\begin{pmatrix} X_i \\ Y_i \end{pmatrix} = \begin{pmatrix} 1+A & B \\ C & 1+D \end{pmatrix} \begin{pmatrix} x_i \\ y_i \end{pmatrix} + \begin{pmatrix} E \\ F \end{pmatrix} \quad (13)$$

Next, Steps 105 and 106 are executed with respect to each shot area $ES_j$ (j=1 to m) on the wafer W shown in FIG. 4, thereby carrying out exposure. At this time, the design array coordinates of the center point of each shot area $ES_j$ is expressed by $(x_{expj}, y_{expj})$, and the design array coordinates $(x_{expj}, y_{expj})$ are substituted into Eq. 13 to thereby obtain calculated array coordinates (existence coordinates) $(X_{expj}, X_{expj})$. Then, the wafer stage 3 in the apparatus shown in FIG. 2 is driven to align the position given by the calculated array coordinates $(X_{expj}, X_{expj})$ with the center position of the projected image of the reticle pattern, which has previously been obtained, in the stage coordinate system. Thereafter, the pattern image of the reticle R is transferred onto the shot area $ES_j$ by exposure.

As has been described above, in this embodiment a reliability value is quantified for each alignment datum on the basis of alignment data obtained by actual measurement, but not on the basis of the condition of the detection signal obtained by the alignment sensor. Accordingly, even in a case where alignment data becomes jump data on account of local distortion of the wafer surface or other causes, alignment can be accurately effected because the reliability value for the jump data becomes low.

In this embodiment, the reliability value is expressed by Eq. 9. In a case where the first alignment datum, for example, is a jump datum, if (n−1) alignment data, excluding the first alignment datum, contain only a completely linear error, the right-hand side of Eq. 9 is zero. In other words, the reliability value for the first alignment datum is zero. On the other hand, no matter which of the other (n−1) alignment data is excluded, the resulting reliability value assumes a finite value because of the influence of the first alignment datum. Accordingly, the reliability value for the first alignment datum is zero, and the reliability values of the other alignment data assume a certain finite value. Therefore, transformation parameters can be obtained independently of the first alignment datum.

Next, a second example of a method of quantifying a reliability value for each alignment datum will be explained.

In the second example, first, with respect to the first alignment datum $(\alpha_1,\beta_1)$, the values $A_1$, $B_1$, $C_1$, $D_1$, $E_1$ and $F_1$ of the six transformation parameters A to F are obtained from Eqs. 7 and 8 in the same way as in the above-described example. Thereafter, the design array coordinates $(x_1,y_1)$ and the six transformation parameter values $A_1$ to $F_1$ are substituted into Eq. 5, and a difference $(\delta_{x1},\delta_{y1})$ between the coordinates obtained from Eq. 5 and the alignment data item $(\alpha_1,\beta_1)$ is calculated as expressed by the following equation 14:

$$\begin{pmatrix} \delta_{x1} \\ \delta_{y1} \end{pmatrix} = \begin{pmatrix} \alpha 1 \\ \beta 1 \end{pmatrix} - \begin{pmatrix} A_1 & B_1 \\ C_1 & D_1 \end{pmatrix} \begin{pmatrix} x_1 \\ y_1 \end{pmatrix} - \begin{pmatrix} E_1 \\ F_1 \end{pmatrix} \quad (14)$$

From the difference $(\delta_{x1},\delta_{y1})$, a reliability value $(h_{x1},h_{y1})$ for the first alignment datum is obtained as expressed by the following equation 15. That is, in this example, the reliability value is the reciprocal of a value obtained by adding a predetermined offset (1 in this example) to the absolute value of the difference $(\delta_{x1},\delta_{y1})$.

$$\begin{pmatrix} h_{x1} \\ h_{y1} \end{pmatrix} = \begin{pmatrix} 1/(1 + |\delta_{x1}|) \\ 1/(1 + |\delta_{y1}|) \end{pmatrix} \quad (15)$$

Similarly, reliability values $(h_{x2},h_{y2})$ to $(h_{xn},h_{yn})$ are obtained with respect to the second to n-th alignment data.

In the second example, in a case where the first alignment datum, for example, is a jump datum, the absolute value of Eq. 14 is large. Conversely, if the first alignment datum is not a jump datum, the absolute value of Eq. 14 is small. Therefore, the reciprocal of the absolute value of Eq. 14 can be approximately regarded as a reliability value. The reason why 1 is added in Eq. 15 before the reciprocal is taken as a reliability value is to obtain a finite value when the reciprocal is taken as a reliability value because, if the reciprocal is merely taken, the value of Eq. 14 can become zero.

Next, a third example of a method of quantifying a reliability value or confidence level for each alignment datum will be explained.

In the third example, first, a reliability value $(h_{xi},h_{yi})$ is obtained for each alignment datum $(\alpha_i,\beta_i)$ from an equation similar to Eq. 9 in the same way as in the example shown in FIG. 1. Thereafter, a weighted residual error component $(\epsilon_x,\epsilon_y)$ is obtained by using the following equation 16 in place of Eq. 10:

$$\begin{pmatrix} \epsilon_x \\ \epsilon_y \end{pmatrix} = \begin{pmatrix} \sum_{i}^{n} h_{xi}^{\gamma}(\alpha_i - \alpha M_i)^2 \\ \sum_{i}^{n} h_{yi}^{\gamma}(\beta_i - \beta M_i)^2 \end{pmatrix} = \begin{pmatrix} \sum_{i}^{n} h_{xi}^{\gamma}(\alpha_i - Ax_i - By_i - E)^2 \\ \sum_{i}^{n} h_{yi}^{\gamma}(\beta_i - Cx_i - Dy_i - F)^2 \end{pmatrix} \quad (16)$$

In Eq. 16, $\gamma$ is a real number not less than zero. That is, in this example, the $\gamma$-th power of the reliability value $(h_{xi},h_{yi})$ is used as a weight to be added to each alignment datum $(\alpha_i,\beta_i)$. Thereafter, values of the transformation parameters A to F are obtained from Eq. 16, and alignment and exposure are carried out in the same way as in the example shown in FIG. 1.

In the third example, the $\gamma$-th power of the reliability value is used as a weight to be added to each alignment datum, as expressed by Eq. 16. In this case, if $\gamma=1$, needless to say, the result becomes equal to that in the above-described first and second examples. However, by appropriately setting the value of γ, the effect of the reliability value can be controlled. More specifically, if γ<1, the effect of the reliability value can be reduced, whereas, if γ>1, the effect of the reliability value can be intensified. If γ=0, the result is the same as that in the conventional EGA alignment method which uses no confidence level.

Although in the foregoing embodiment an LSA type alignment sensor used as an alignment sensor, it should be noted that other types of alignment sensor are also usable, for example, an imaging (FIA) alignment sensor in which wafer marks are imaged and subjected to image processing to effect position detection, or a two-beam interference (LIA) alignment sensor in which a diffraction grating-shaped wafer mark is illuminated with two coherent light beams to generate two diffracted light beams, and position detection is effected on the basis of the phase of light formed by interference between the two diffracted light beams. Further, the alignment optical system is not necessarily limited to the TTL type, but it is also possible to use other types of alignment optical system, for example, an off-axis or TTR (Through-The-Reticle) type alignment optical system.

Thus, the present invention is not necessarily limited to the above-described embodiment, but may adopt various arrangements without departing from the gist of the present invention.

According to the present invention, a reliability value is obtained for each measured value on the basis of measured array coordinates. Therefore, the effect of jump data in the measured coordinate values can be accurately reduced without depending on the condition of the detection signal of alignment marks (wafer marks) or the like. That is, the reliability value can be accurately quantified even in the case of using an alignment sensor in which there is no correlation between the intensity or signal waveform of the detection signal during alignment and the reliability value of the measured array coordinates (alignment data).

According to the first method of quantifying a reliability value, if the first measured value, for example, is a jump datum, and (n−1) measured values, excluding the first measured value, contain only a linear error, then the resulting dispersion is zero. In other words, the reliability value for the first measured value is zero. On the other hand, no matter which of the other (n−1) alignment data is excluded, the reliability value assumes a finite value because of the influence of the first measured value. Accordingly, the reliability value can be accurately quantified.

According to the second method of quantifying a reliability value, if the first measured value, for example, is a jump datum, the resulting difference is large, and the reciprocal of the difference assumes a small value. Accordingly, the confidence level can be accurately quantified.

In a case where the γ-th power of the reliability value is used as a weight to be added to the corresponding alignment data item, the effect of the reliability value can be controlled by appropriately setting the value of γ. That is, if γ<1, the effect of the reliability value can be reduced, whereas, if γ>1, the effect of the reliability value can be intensified. If γ=0, the result is the same as in the conventional alignment method which uses no reliability value.

What is claimed is:

1. An alignment method for aligning a plurality of exposure areas on a substrate, said method comprising the steps of:

(1) measuring array coordinates of a plurality of alignment marks which are associated with N (N is an integer of 3 or more) exposure areas among said plurality of exposure areas on said substrate;

(2) determining a reliability value for each of the array coordinates measured at said step (1), the i-th (i is an integer from 1 to N) reliability value being determined on the basis of (a) the measured results of (N−1) array coordinates from which the measured result of the i-th array coordinate is excluded, and (b) design array coordinates on said substrate;

(3) obtaining actual array coordinates of said plurality of exposure areas on the basis of said design array coordinates, said array coordinates measured at said step (2) and the reliability value determined at said step (2); and (4) sequentially aligning each of said plurality of exposure areas on the basis of the actual array coordinates obtained at said step (3).

2. The alignment method according to claim 1, wherein said step (2) obtains said i-th reliability value from a dispersion of (N−1) non-linear errors excluding the measured results of said i-th array coordinate.

3. The alignment method according to claim 2, wherein the reliability value having a small dispersion is less than the reliability value having a large dispersion.

4. The alignment method according to claim 1, further including the step of weighting said determined reliability value.

5. The alignment method according to claim 1, wherein said alignment method is used in a lithography process for manufacturing at least one of semiconductor devices and liquid crystal display devices.

6. The alignment method according to claim 1, wherein said alignment method is performed by using an alignment sensor of an image pick-up type which picks up images of said alignment marks and processes the images.

7. The alignment method according to claim 1, wherein said alignment marks are provided in respective centers of said desired number of exposure areas.

8. The alignment method according to claim 1, wherein the measurement of the alignment mark for each of said desired number of exposure areas is carried out by measuring coordinate positions in directions of two coordinate axes perpendicularly intersecting each other.

9. The alignment method according to claim 1, wherein the measurement of the alignment mark for each of said desired number of exposure areas is carried out by selectively measuring a coordinate position in either one of directions of two coordinate axes perpendicularly intersecting each other.

10. An alignment method for aligning a plurality of exposure areas on a substrate placed on a substrate stage, said method comprising the steps of:

(1) measuring array coordinates of a plurality of alignment marks which are associated with N (N is an integer of 3 or more) exposure areas among said plurality of exposure areas on said substrate;

(2) determining a reliability value for each of the array coordinates measured at said step (1), the i-th (i is an integer from 1 to N) reliability value being determined on the basis of (a) the measured results of (N−1) array coordinates from which the measured result of the i-th array coordinate is excluded and (b) design array coordinates on said substrate;

(3) obtaining a plurality of transformation parameters which transform said design array coordinates into array coordinates on said substrate stage on the basis of the reliability value determined at said step (2);

(4) obtaining actual array coordinates of said plurality of exposure areas on the basis of said plurality of transformation parameters; and (5) sequentially aligning each of said plurality of exposure areas on the basis of the actual array coordinates obtained at said step (4).

11. The alignment method according to claim 10, wherein said step (2) obtains said i-th reliability value from a dispersion of (N−1) non-linear errors excluding the measured results of said i-th array coordinate.

12. The alignment method according to claim 11, wherein the reliability value having a small dispersion is less than the reliability value having a large dispersion.

13. The alignment method according to claim 10, further including the step of weighing said determined reliability value.

14. The alignment method according to claim 10, wherein said alignment method is used in a lithography process for manufacturing at least one of semiconductor devices and liquid crystal display devices.

15. The alignment method according to claim 10, wherein said alignment marks are provided in respective centers of said desired number of exposure areas.

16. The alignment method according to claim 10, wherein the measurement of the alignment mark for each of said desired number of exposure areas is carried out by measuring coordinate positions in directions of two coordinate axes perpendicularly intersecting each other.

17. The alignment according to claim 10, wherein the measurement of the alignment mark for each of said desired number of exposure areas is carried out by selectively measuring a coordinate position in either one of directions of two coordinate axes perpendicularly intersecting each other.

18. An alignment method for aligning each of a plurality of exposure areas on a substrate, said method comprising the steps of:

(1) measuring array coordinates of a plurality of alignment marks which are associated with N (N is an integer of 3 or more) exposure areas among said plurality of exposure areas on said substrate;

(2) determining a reliability value for each of the array coordinates measured at said step (1), the i-th (i is an integer from 1 to N) reliability value being obtained by estimating the i-th array coordinate by a linear approximation calculation using (a) the measured results of (N−1) array coordinates from which the measured result of said i-th array coordinate is excluded and (b) design array coordinates on said substrate, and by obtaining a magnitude of the difference between said estimated i-th array coordinate and said i-th array coordinate measured at step (1), wherein said reliability value being obtained is inversely proportional to the magnitude of the difference;

(3) obtaining actual array coordinates of said plurality of exposure areas on the basis of said design array coordinates, said array coordinates measured at said step (1) and the reliability value determined at said step (2); and (4) sequentially aligning each of said plurality of exposure areas on the basis of the array coordinate obtained at said step (3).

* * * * *